United States Patent
Angelov et al.

(10) Patent No.: US 9,812,349 B2
(45) Date of Patent: Nov. 7, 2017

(54) CONTROL OF THE INCIDENCE ANGLE OF AN ION BEAM ON A SUBSTRATE

(71) Applicant: Lam Research Corporation, Fremont, CA (US)

(72) Inventors: Ivelin Angelov, San Jose, CA (US); Ivan L. Berry, III, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/956,154

(22) Filed: Dec. 1, 2015

(65) Prior Publication Data
US 2017/0154804 A1   Jun. 1, 2017

(51) Int. Cl.
*H01L 21/687* (2006.01)
*H01L 21/67* (2006.01)
*H01L 21/3065* (2006.01)

(52) U.S. Cl.
CPC .... *H01L 21/68764* (2013.01); *H01L 21/3065* (2013.01); *H01L 21/67069* (2013.01)

(58) Field of Classification Search
CPC .............. H01L 21/3065; H01L 21/67069
See application file for complete search history.

(56) References Cited

U.S. PATENT DOCUMENTS

| 2015/0179465 A1 | 6/2015 | Singh et al. | |
| 2015/0243542 A1* | 8/2015 | Yoshihara | H01L 21/68764 156/345.15 |
| 2016/0111294 A1* | 4/2016 | Berry, III | H01L 21/3065 438/157 |

OTHER PUBLICATIONS

Ion Beam Etch Without Need for Wafer Tilt or Rotation—Specification, Claims, Abstract and Drawings; U.S. Appl. No. 14/592,820; Inventor(s) Berry III et al.; filed Jan. 8, 2015.
Use of Ion Beam Etching to Generate Gate-All-Around Structure—Specification, Claims, Abstract and Drawings; U.S. Appl. No. 14/520,070; Inventor(s) Berry III et al.; filed Oct. 21, 2014.

* cited by examiner

*Primary Examiner* — Duy Deo
(74) *Attorney, Agent, or Firm* — Martine Penilla Group, LLP (57) ABSTRACT

One system includes a chamber, a chuck assembly, and an ion source. The chuck assembly includes a substrate support and a precession assembly with a center support coupled to a stationary center point of an under region of the substrate support. The precession assembly includes first and second actuators connected to first and second locations, respectively, that are in the under region off-set from the center point. The precession assembly imparts a precession motion to the substrate support when the first actuator and the second actuator move up and down relative to the center support, and the precession motion imparted to the substrate causes a rotating tilt of the substrate support without rotation of the substrate support. The rotating tilt of the substrate is configured to cause ions generated by the ion source to impinge upon a surface of the substrate in continually varying angles of incidence.

6 Claims, 8 Drawing Sheets

Ion incidence angle changes depending on the position of the wafer. Some features are blocked at certain angles but ions will reach the features at other angles

CONTROL OF THE INCIDENCE ANGLE OF AN ION BEAM ON A SUBSTRATE

BACKGROUND

1. Field of the Invention

The present embodiments relates to methods, systems, and programs for improving etching on a semiconductor manufacturing chamber, and more particularly, methods, systems, and computer programs for controlling the direction of an ion beam on the surface of the substrate.

2. Description of the Related Art

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus.

Plasma contains various types of radicals, as well as positive and negative ions. The chemical reactions of the various radicals, positive ions, and negative ions are used to etch features, surfaces and materials of a substrate.

In some chambers, the substrate is supported by a chuck that spins in order to control how the ions coming from the plasma impinge on the surface of the substrate. Keeping the substrate at a constant or controlled temperature requires liquid or gas cooling of the rotating substrate, and may also require electrostatic clamping of the substrate to the rotating fixture. To get the liquid or gas, and the electrical utilities to the rotating fixture requires a rotating journal and rotating slip rings. Such journals and slip rings have limited lifetime due to rotating-seal failure or contactor failure. The lifetime is usually a function of the number of rotations, and faster rotations generally result in shorter journal lifetime.

What is desired is to eliminate the rotating journals while still achieving uniform etching. It is in this context that embodiments arise.

SUMMARY

Methods, devices, systems, and computer programs are presented for controlling the angle of incidence of an ion beam on a substrate. It should be appreciated that the present embodiments can be implemented in numerous ways, such as a method, an apparatus, a system, a device, or a computer program on a computer readable medium. Several embodiments are described below.

A system for processing a substrate includes a chamber, a chuck assembly, and an ion source. The chuck assembly includes a substrate support and a precession assembly. The precession assembly has a center support that is coupled to a center point of an under region of the substrate support, the center support being stationary. The precession assembly further includes a first actuator and a second actuator, the first actuator being connected to a first location in the under region off-set from the center point, and the second actuator being connected to a second location in the under region off-set from the center point. The precession assembly is programmed to cause a precession motion to be imparted to the substrate support when the first actuator and the second actuator move up and down relative to the center support, such that the first actuator moves up and down in accordance with a first frequency and the second actuator moves up and down in accordance with a second frequency, the first frequency being independent of the second frequency. The ion source is interfaced with the chamber, and the ion source is directionally oriented toward the substrate support of the chuck assembly, where the ion source is configured to produce ions when the plasma is struck and the ions are directed toward the substrate support. The precession motion is imparted to the substrate support when the substrate is present on the substrate support, the precession motion causing a rotating tilt of the substrate support without rotation of the substrate support. The rotating tilt of the substrate is configured to cause the ions generated by the ion source to impinge upon a surface of the substrate in continually varying angles of incidence.

Another system for processing a substrate includes a chamber, a chuck assembly, and an ion source. The chuck assembly includes a substrate support and a precession assembly. The precession assembly includes a center support, a first rotating cam, and a second rotating cam, where the center support is stationary and coupled to a center point of the bottom surface of the substrate support. The first rotating cam is connected to a first location that is in the bottom surface and off-set from the center point, and the second rotating cam is connected to a second location that is in the bottom surface and off-set from the center point. Further, the precession assembly is programmed to cause a precession motion to be imparted to the substrate support when the first rotating cam and the second rotating cam move up and down the first location and the second location. The first rotating cam moves independently from the second rotating cam. The ion source is oriented toward the substrate support, and the ion source produces ions when the plasma is struck. The precession motion causes a rotating tilt of the substrate support without rotation of the substrate support, the rotating tilt of the substrate being configured to cause the ions generated by the ion source to impinge upon a surface of the substrate in continually varying angles of incidence.

A method for processing a substrate includes an operation for loading a substrate on a substrate support within a chamber. The method further include an operation for causing, by a precession assembly, a precession motion of the substrate support, where the precession motion is imparted when the substrate is on the substrate support. The precession motion causes a rotating tilt of the substrate support without rotation of the substrate support, the rotating tilt of the substrate being configured to cause ions, generated by an ion source above the chamber, to impinge upon a surface of the substrate continually varying angles of incidence. The precession assembly includes a center support, a first actuator, and a second actuator. The center support is stationary and coupled to a center point of an under region of the substrate support, the first actuator is connected to a first location that is in the under region of the substrate support and off-set from the center point, and the second actuator is connected to a second location that is in the under region of the substrate support and off-set from the center point. The precession motion is created when the first actuator and the second actuator move up and down relative to the center support, such that the first actuator moves up and down in accordance with a first frequency and the second actuator moves up and down in accordance with a second frequency, the first frequency being independent of the second frequency.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Embodiments provide a wobbling motion to a chuck in order to change the position of the substrate supported by the chuck. By changing the position of the substrate, the angle of the ion beams from the plasma can be controlled. This allows the substrate to change position without having to spin the substrate, which results in savings in manufacturing by avoiding expensive components required to rotate the substrate.

The following embodiments describe methods, devices, systems, and computer programs for controlling the angle of incidence of an ion beam on a substrate. It will be apparent, that the present embodiments may be practiced without some or all of these specific details. In other instances, well-known process operations have not been described in detail in order not to unnecessarily obscure the present embodiments.

Figure 1:
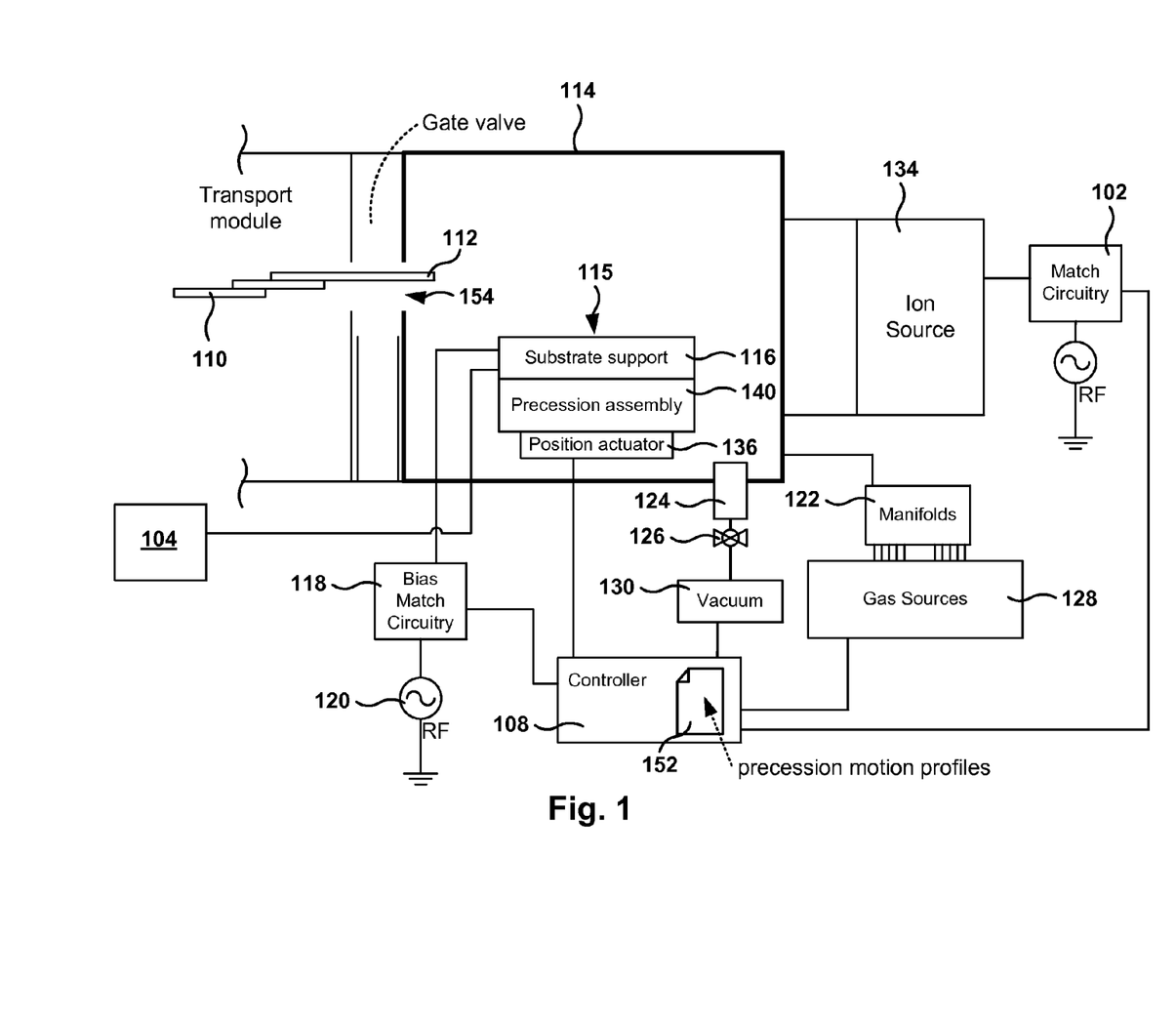
FIG. 1 is a schematic cross-section diagram showing a plasma processing system utilized for etching operations, in accordance with one embodiment.

FIG. 1 is a schematic cross-section diagram showing a plasma processing system utilized for etching operations, in accordance with one embodiment. The system includes a transport module 110 that carries the substrate, a gate valve, and chamber 114. The substrate 112 enters the chamber through a substrate load 154, with the substrate 112 being in a horizontal position when the substrate enters the chamber 114. The chamber includes chuck assembly 115 and position actuator 136. Chuck assembly 115 includes substrate support 116 and precession assembly 140. In some embodiments a dielectric window 106 is also present (not shown) in the chamber.

The substrate support 116 can be an electrostatic chuck for supporting substrate 112. Precession assembly 140 applies a precession motion to the substrate support during operation to change the angle of incidence of ions from the plasma when striking the wafer, as discussed in more detail below.

Position actuator 136 rotates the chuck assembly 90° after the substrate has been loaded, in order to perform the processing of the substrate while the substrate is in the vertical position. Although the embodiment shown in FIG. 1 is for processing substrates in the vertical position, the principles presented herein to apply motion to the wafer/chuck may also be utilized in chambers that process the substrate in the horizontal position.

Facilities 104 are connected to the chuck assembly to provide electrical power to the substrate support, or to provide liquid or gas to cool the substrate during operation. An ion source 134 generates the plasma for processing the substrate. In some embodiments, an internal faraday shield (not shown) is disposed inside the chamber 100. In some embodiments, the ion source 134 is a TCP coil connected to match circuitry 102.

Further shown is a bias RF generator 120, which can be defined from one or more generators. If multiple generators are provided, different frequencies can be used to achieve various tuning characteristics. A bias match 118 is coupled between the RF generator 120 and a conductive plate of the assembly that defines the substrate support 116. The substrate support 116 also includes electrostatic electrodes to enable the chucking and dechucking of the substrate. Broadly, a filter and a DC clamp power supply can be provided. Other control systems for lifting the substrate off of the substrate support 116 can also be provided.

Gas sources 128 include a plurality of gas sources that can be mixed through manifolds 122. The gas sources include one or more reactant gases (also referred to herein as main gases) and one or more tuning gases. A reactant gas is an active gas used for etching, and the reactant gas is a source of the species necessary for etching over the substrate. Examples of reactant gases include $Cl_2$, HBr, and $SF_6$, but other reactant gases may also be used. It should be appreciated that multiple gas supplies may be provided for supplying different gases to the chamber for various types of operations, such as process operations on substrates, substrate-less auto-cleaning operations, and other operations.

A vacuum pump 130 is connected to the chamber 114 to enable vacuum pressure control and removal of gaseous byproducts from the chamber during operational plasma processing. A valve 126 is disposed between exhaust 124 and the vacuum pump 130 to control the amount of vacuum suction being applied to the chamber.

The chamber 114 will also operate at vacuum conditions in the range of between about 1 m Torr (mT) and about 500 m Torr (mT). Although not all specifically shown, chamber 114 is typically coupled to facilities when installed in a clean room, or a fabrication facility. Facilities include plumbing that provide processing gases, vacuum, temperature control, and environmental particle control.

A programmable controller 108 is provided for controlling the operation of the chamber 114 and its associated components. Broadly speaking, the controller 108 can be programmed to execute a chamber operation defined by a recipe. A given recipe may specify various parameters for the operation, such as the application of power to the TCP coils, the flow of gas into the chamber, and the application of vacuum. It should be appreciated that the timing, duration, magnitude, or any other adjustable parameter or controllable feature can be defined by a recipe and carried out by the controller to control the operation of the chamber 114 and its associated components. Additionally, a series of recipes may be programmed into the controller 108.

In one embodiment, the controller includes, or has access to, plurality of precession motion profiles 152, where each procession motion profiles includes instructions for generating the procession motion in a particular operation in the chamber. The precession motions vary the type of motion applied to the chuck, such as frequency or amplitude of the motion, as discussed in more detail below.

Figure 2:
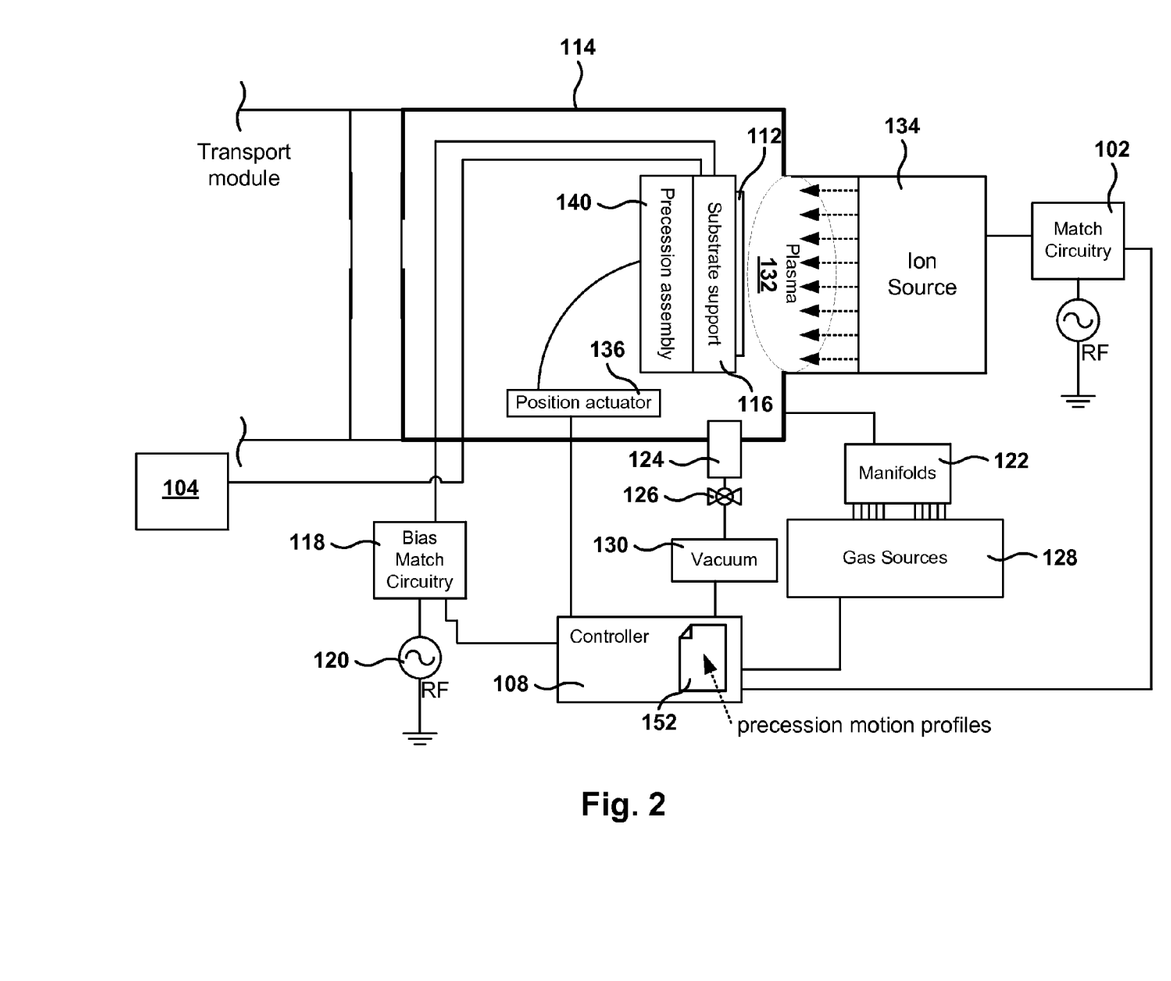
FIG. 2 illustrates the chamber during operation, according to one embodiment.

FIG. 2 illustrates the chamber during operation, according to one embodiment. In one embodiment, the substrate 112 is loaded into the substrate support 116, and after the substrate is loaded, the position actuator rotates substrate support 116 90° to place substrate support 116 and substrate 112 in a vertical position before the plasma is ignited. The ion source 134 is disposed on the side of the chamber in a vertical orientation. It is noted that embodiments may be implemented in chambers that operate with the chuck in a vertical position or in a horizontal position.

In prior solutions, the substrate is rotated (e.g., 10-120 revolutions per minute (RPM)) to change the angle of the substrate with reference to the plasma, i.e., the ion beam striking the substrate. The chuck holds the substrate, and the chuck has to have a high voltage connection (e.g., facilities 104) and water cooling to control the temperature of the substrate, so the substrate does not become too hot due to the proximity to the plasma.

The problem with rotating the substrate is how to get electrical, water, and even gas (in some embodiments) to the chuck. Water, gas, and electrical connections must be connected, and these connections require custom-built (or expensive) mechanical unions that can transport those facilities through a spindle. The problem is that rotating mechanical unions fail over time, and the time-to-failure usually depends on the number of rotations. The more the chuck spins, the sooner the spinning parts fail. Further, failure can be catastrophic, because failure may cause water in the chamber, or gases in a place where the gases can cause harm.

Figure 3:
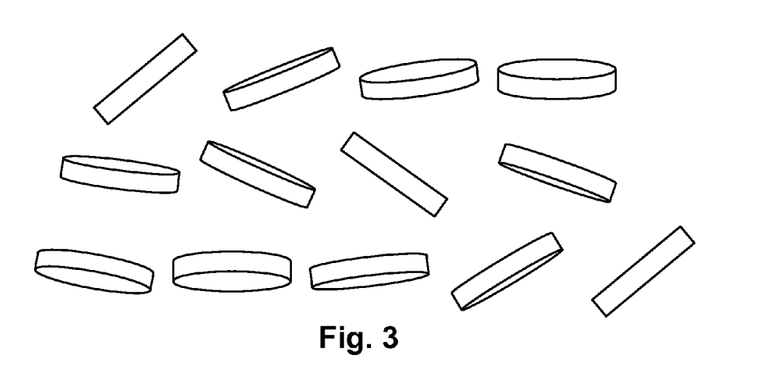
FIG. 3 illustrates a plurality of substrate positions when the substrate is tilted during processing, according to one embodiment.

FIG. 3 illustrates a plurality of substrate positions when the substrate is tilted during processing, according to one embodiment. FIG. 3 illustrates the positions of the substrate when processing the substrate in a horizontal initial position. Instead of rotating the chuck, the chuck and the substrate are moved around without actually rotating the chuck/substrate. The chuck is subject to a precession motion, and the precession moves in a circular fashion, but without spinning the chuck. The precession motion could be described as a controlled wobble effect on the substrate, where the highest point of the substrate changes over time, where any of the points on the periphery of the substrate could be the highest point of the substrate at some time. That is, the tilt axis of the substrate changes over time, while the center of the substrate remains substantially stationary. In one embodiment, there is a rotating tilt of the surface of the substrate as the precession motion is applied. It is similar to a planetary-type oscillation. However, it is noted that the precession motion does not include rotation (e.g., spinning) of the chuck/wafer.

It is contemplated that in other embodiments, the center of the chuck may also move up and down to produce the same precession effect, but still without rotating the chuck.

Such a motion achieves the same effect as tilting and 360° rotation of the chuck without requiring fixture rotation. All water, air, and electrical connections can be made by flexible wires, or tubes. FIG. 3 illustrates different positions of the substrate over time. The different positions show that the highest point of the substrate changes over time, the angle of the top surface of the substrate with reference to the plasma also changes over time, and the tilt of the top surface of the substrate rotates over time, without having chuck rotation.

Figure 4A:
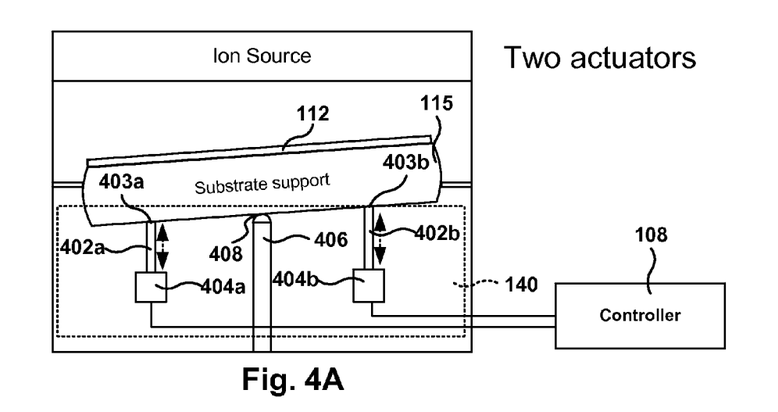
FIGS. 4A-4B illustrate a chamber where the precession motion applied to the chuck/substrate is performed by two actuators, according to one embodiment.
Figure 4B:
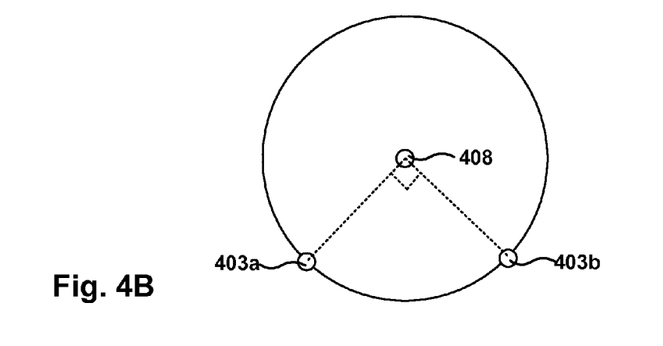

FIGS. 4A-4B illustrate a chamber where the precession motion applied to the chuck/substrate is performed by two actuators, according to one embodiment. FIG. 4A is a side view of a chamber for processing substrate 112. Precession assembly 140 includes two actuators 404a and 404b that are connected to the bottom surface of substrate support 115 at locations 403a and 403b, which are away from the center of substrate support 115.

In general, an actuator is a type of motor that is responsible for moving or controlling a mechanism or system. A mechanical actuator functions by converting rotary motion into linear motion to execute movement. It may involve gears, rails, pulleys, chains or other devices to create the linear motion. An example is a rack and pinion actuator that includes a pair of gears which convert rotational motion into linear motion. A circular gear called the pinion engages teeth on a linear gear bar called the rack. The rotational motion applied to the pinion causes the rack to move relative to the pinion, thereby translating the rotational motion of the pinion into linear motion. Actuators 404a and 404b move racks 402a and 402b under the substrate support 115 to create the precession motion of the substrate support.

In addition, precession assembly 140 includes a fixed support 406, which makes contact at point 405 with the bottom surface of substrate support 115. In one embodiment, substrate support rests on top of point 408, but other embodiments may include different couplings between fixed support 406 and substrate support 115, as long as substrate support 115 is able to pivot around point 408 when the precession motion is applied.

In one embodiment, actuator racks 402a and 402b are connected to the bottom surface of substrate support 115 in the periphery of the bottom surface of substrate support 115. The contact points for actuator racks 402a and 402b are separated a certain angle with reference to the center point of the substrate support. FIG. 4B illustrates a top view of substrate support 115, which includes a contact point 408 in the center of the bottom surface of the substrate support 115, and actuator racks 402a and 402b connected at the periphery of the substrate support at points 403a and 403b, respectively. In the exemplary embodiment of FIG. 4B, actuator racks 402a and 402b are separated 90° with reference to the center of the bottom surface of the substrate support 115, but in other embodiments other separation angles are possible, such as 30°, 135°, or any angle in the range between 10° and 350°.

As actuator racks 402a and 402b move up and down, the corresponding contact points 403a and 403b also move up and down, which causes the precession motion of the chuck. The orientation of the surface of the substrate is the same as the orientation of the substrate support, which is defined by the plane that includes the three points 408, 403a and 403b.

Each of the actuator racks may go up and down a configurable height, also referred to as amplitude, and may go up and down at a certain frequency. Both the amplitudes and frequencies of the actuators are independently controlled and are independent from each other, thus the controller 108 is able to generate different precession effects based on the frequencies and amplitudes. For example, in some operations the precession effect is fast, but in other operations the precession effect is slow, depending on the desired effect on the substrate. This provides flexibility because the processing recipe can change the frequencies and amplitudes of the actuators depending on each processing step (e.g., depending on the aspect ratio).

In this embodiment, precession assembly 140 includes the two actuators 404a, 404b with the respective actuator racks 402a and 402b, and the fixed support 406. It is noted that the embodiments illustrated in FIGS. 4A-4B are exemplary. Other embodiments may connect the actuators on different parts of the chuck, as long as the precession motion is generated, or the fix point on the bottom of the chuck is away from center, etc. The embodiments illustrated in FIGS. 4A-4B should therefore not be interpreted to be exclusive or limiting, but rather exemplary or illustrative.

Figure 5A:
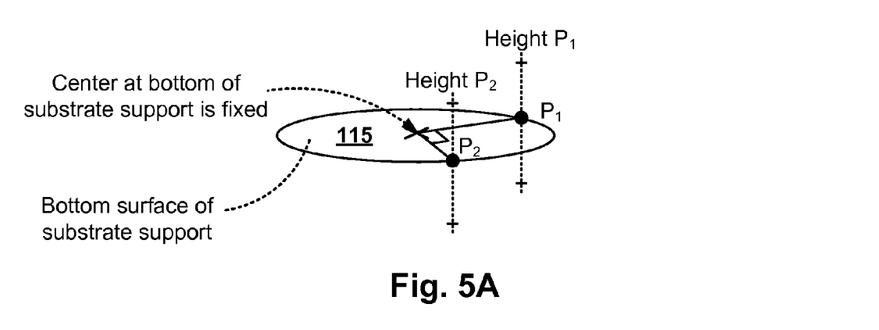
FIG. 5A illustrates the precession motion of the substrate by moving two peripheral points up and down, according to one embodiment.

FIG. 5A illustrates the precession motion of the substrate support by moving two peripheral points up and down, according to one embodiment. In the embodiment of FIG. 5A, two points on the periphery of the bottom of the substrate support are moved up and down to generate the precession effect. For example, points $P_1$ and $P_2$ may be controlled by the two actuators of FIG. 4A, or the rotating cams of FIG. 6A described below. In the exemplary embodiment of FIG. 5A, points $P_1$ and $P_2$ are separated by 90° with reference to the center of the substrate support, but other embodiments may have different angular separations for points $P_1$ and $P_2$.

Over time, the center of the substrate support remains stationary and each of the points $P_1$ and $P_2$ moves up and down with a certain defined amplitude. Therefore, the position of the bottom surface of the substrate support, at any point in time, is determined by three points: the center, point $P_1$, and point $P_2$.

Points $P_1$ and $P_2$ move independently from each other, and are controlled separately and independently by the controller. Therefore, the position of the substrate with reference to the plasma can change over time, allowing for infinite possibilities for the orientation of the surface of the substrate as the points move up and down. The embodiment of FIG. 5A shows substrate support 115 in a horizontal position.

Figure 5B:
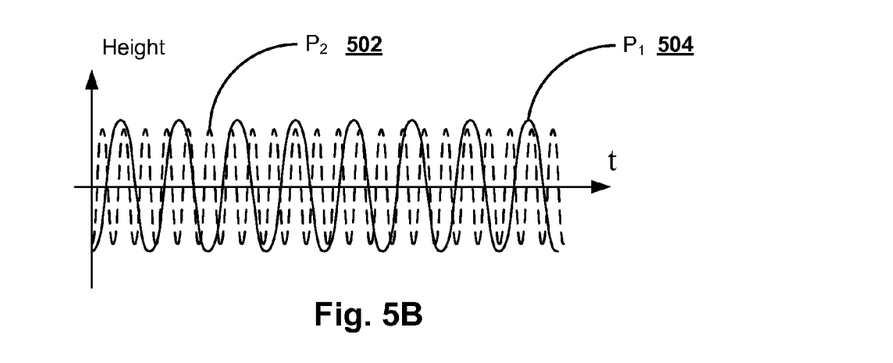
FIG. 5B is a chart showing the changes in height of the two peripheral points over time, according to one embodiment.

FIG. 5B is a chart showing the changes in height of the two peripheral points over time, according to one embodiment. In one embodiment, the height of each point $P_1$ and $P_2$, when tracked over time, shows a cyclical sinusoidal shape, which depends on the amplitude of the change (e.g., the maximum and minimum heights) as well as the frequency. Because of the sinusoidal movement, the motion of the substrate is smooth, without jerky moves that may damage the substrate. In other embodiments, the height profile of the points is not sinusoidal and may follow other cyclical or non-cyclical motion patterns.

In the exemplary embodiment of FIG. 5B, the trajectory of point $P_1$ is tracked on line 504 and the trajectory of point $P_2$ is tracked on line 502. In this embodiment, the frequencies are different and the amplitudes also are different, but in other embodiments the amplitudes might be the same and the frequency may also be the same. Although, if both frequencies are equal, the substrate may teeter totter without changing the precession of the substrate circularly.

In one embodiment, the frequency of the motion for one point is determined by an actuator that cycles at 120 times per minute, but other values are also possible. For example, the actuator may cycle at a frequency in the range from 5-200 times per minute, or in the range between 30-150 times per minute. In one embodiment, the frequencies of the actuators are not multiple of each other in order to avoid resonance patterns.

The controller is able to obtain the desired precession/circular effect on the substrate by controlling independently both points, $P_1$ and $P_2$. In other embodiments, different combinations are possible. For example, point $P_1$ may move very slowly while point $P_2$ moves very fast, causing a teeter totter like effect on the substrate, where the teeter totter changes the angle slowly over time. In other embodiments, both frequencies are low, resulting in a slow change of the orientation of the surface of the substrate, and in another embodiment, both frequencies are fast, resulting in quick changes of the orientation of the surface of the substrate with reference to the plasma.

Figure 5C:
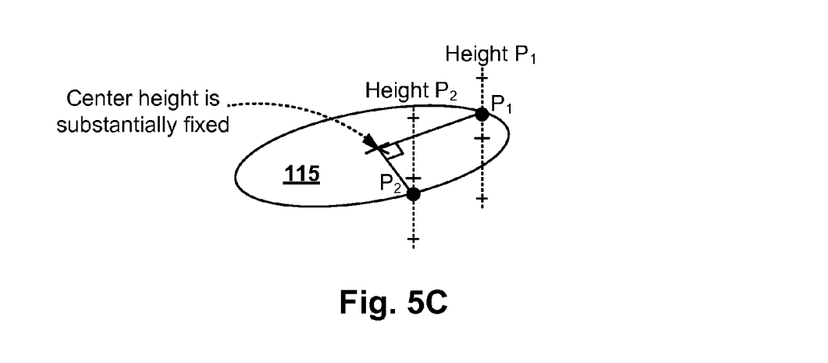
FIG. 5C shows the substrate after the two peripheral points have changed their respective height, according to one embodiment.

FIG. 5C shows the substrate after the two peripheral points have changed their respective height, according to one embodiment. FIG. 5C shows the position of the substrate support 115 after points $P_1$ and $P_2$ have moved. Here, point $P_1$ is about one third of the distance between the stationary position and the maximum height, and point $P_2$ is about one quarter of the distance from the stationary position to the bottom possible height.

The center of the bottom surface of the substrate support remains stationary, and the position of the bottom surface is determined by the center, point $P_1$, and point $P_2$, as three points define the plane of the bottom surface of the substrate support. As points $P_1$ and $P_2$ move, so will the plane defined by the bottom surface of the substrate support. In some embodiments, the tilt of the surface may go up and to 80° with respect to horizontal, but in other embodiments it may be as low as 5°. Therefore, the tilt created by the motion of any point $P_1$ or $P_2$ may be in the range from 3° to 85°, although other values are also possible.

Figure 5D:
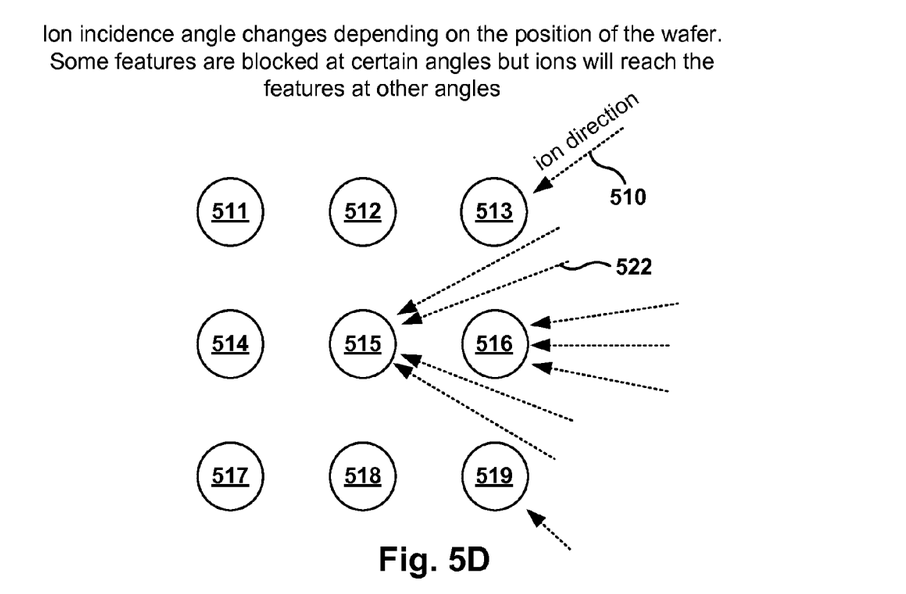
FIG. 5D illustrates the change of the angle of incidence of the ion beam depending on the tilting of the substrate, according to one embodiment.

FIG. 5D illustrates the change of the angle of incidence of the ion beams depending on the precession motion of the substrate, according to one embodiment. Etching starts with a mask. If an ion comes in at a certain angle, the ion will etch some region, but not another one. The angle is a function of the aspect ratio of the structure, and when the angle of the ion beam is increased, it is possible to increase the aspect ratio.

In some etching patterns, there is a plurality of features that follow a regular pattern, such as in a memory chip. Controlling the angle of incidence allows the control of the aspect ratio. However, as the substrate tilts, it is possible that shadows to the ion flow are created. In the exemplary embodiment of FIG. 5D, the ion direction changes depending on the tilt of the surface of the substrate. Sometimes, the ion direction will allow the ions to hit features 515, such as ion beam 522. But other times, the ion direction will be such that the ions will not hit features 515, such as in ion direction 510.

In summary, the ion incidence angle changes depending on the position of the substrate, and some features are blocked at certain angles, while ions will reach the features at other angles.

If the pattern on the substrate is uniform, the controller controls how fast or how slow the tilt changes over time in order to take advantage of the channels that allow the ions to hit the substrate features. This way, some ions come preferentially through these channels.

In one embodiment, the speed of change is not uniform. For example, at times the substrate tilts slowly when the ions are hitting the desired features, but the substrate tilts faster when there are shadows that block the ions from reaching the desired features. In addition to the rate of change of the surface of the substrate, the angle of the precession motion may also be controlled to enhance the incidence of ions on the surface of the substrate based on the process recipe.

Therefore, in one embodiment, the controller determines the rate of change of the precession/tilt of the surface of the substrate based on the angle of incidence of the ions. The controller makes the amount of time that the substrate is in a desired position as large as possible, while the controller makes the amount of time that the substrate is in an undesirable position as low as possible. This improves the aspect ratio and decreases the amount of time required to etch deep features on the substrate.

Figure 6A:
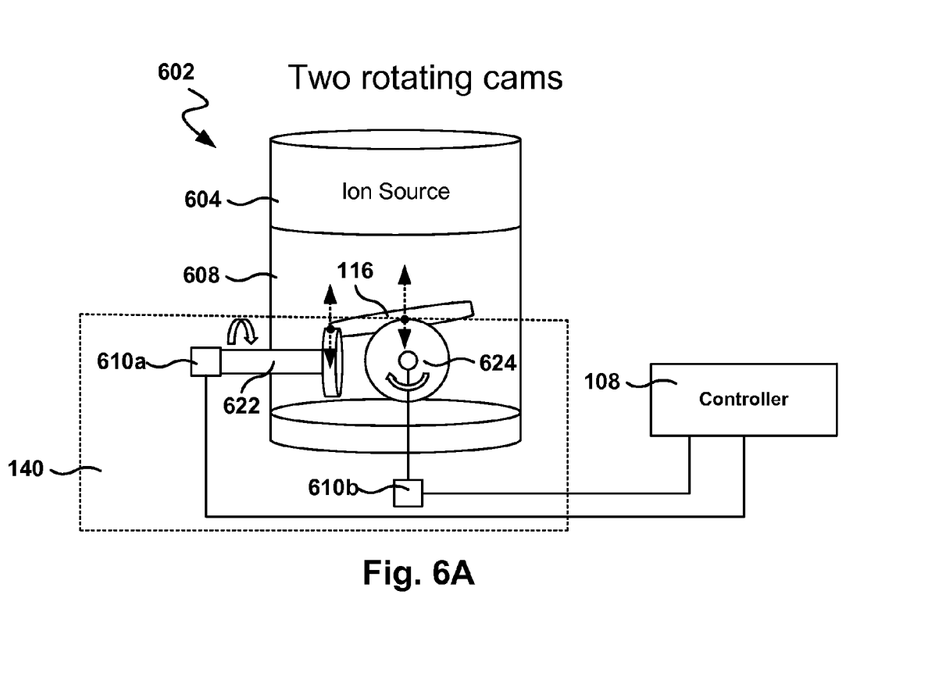
FIG. 6A illustrates a chamber where the precession motion applied to the chuck/substrate is performed by two rotating cams, according to one embodiment.

FIG. 6A illustrates a chamber where the precession motion applied to the chuck/substrate is performed by two rotating cams, according to one embodiment. Substrate support 116 in chamber 608 is connected to two rotating cams 622 and 624. As the rotating cams rotate, each rotating cam moves up and down a point of the substrate support, such as a point on the periphery of the chuck, although other locations are also possible. In one embodiment, the two points moved up and down by the rotating cams are separated 90° with reference to the center of the substrate/chuck, but in other embodiments other degrees of separation are also possible, such as 45°, 135°, or any value in the range from 45° to 180°.

Each of the rotating cams has a cam pin which is attached to a point on the chuck. Depending on the height of the pin, the corresponding point on the chuck will get a different elevation.

Each of the rotating cams can be controlled separately by the controller, and the control includes both the amplitude of the change in elevation as well as the frequency of the rotating cam. The frequencies and amplitudes of each of the rotating cams are independent from each other, and the controller is able to generate different precession effects based on the rotating frequencies of the cams. For example, in some operations the precession effect is fast, but in other operations the precession effect is slow, depending on the desired effect on the substrate. This provides flexibility because the processing recipe can change the frequencies and amplitudes of the rotating cams depending on each processing step (e.g., depending on the aspect ratio).

In this embodiment, precession assembly 140 includes the two rotating camps with the respective actuators, as well as a center support that is fixed (not shown because it is behind rotating cam 624), similar to the fixed support 406 of FIG. 4A.

Figure 6B:
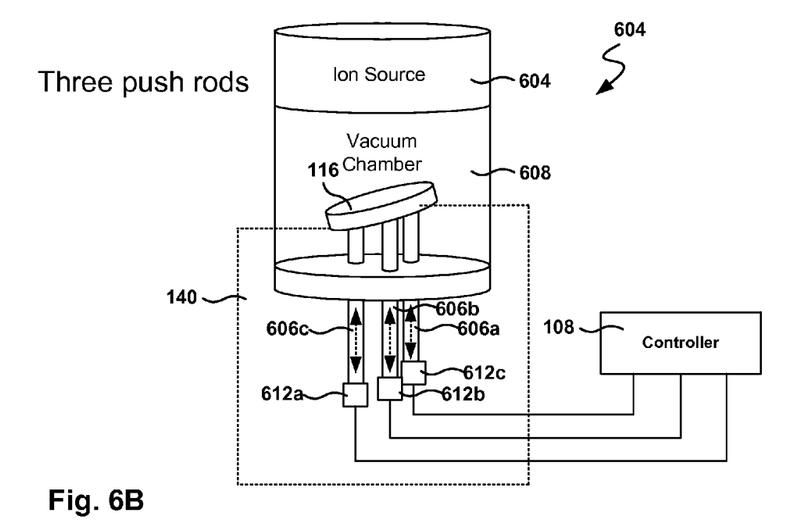
FIG. 6B illustrates a chamber where the precession motion applied to the chuck/substrate is performed by three pushrods connected to the bottom of the chuck, according to one embodiment.

FIG. 6B illustrates a chamber 640 where the precession motion applied to the chuck/substrate is performed by three pushrods connected to the bottom of the chuck, according to one embodiment. In one embodiment, substrate support 116 is moved by three push rods 606a, 606b, and 606c, connected to the bottom of the chuck. The push rods 606a, 606b, and 606c are connected to respective actuators 612a, 612b, and 612c, which are in communication with controller 108. For clarity of description, some of the elements in the chamber have been omitted, including a substrate being held by substrate support 116.

Ion source 604 is above the vacuum chamber 608 and the ion beams from the ion source 604 travel downwards. The three push rods move up and down causing the change in orientation of the surface of the substrate, e.g., the tilting and wobbling of the substrate, i.e., the precession motion. The controller controls the motions of the three push rods 606a, 606b, and 606c in order to produce the desired movement of the chuck. In this embodiment, precession assembly 140 includes the three push rods and their respective actuators.

In another embodiment, one of the push rods is stationary while the other two push rods move up and down, which means that one push rod could be replaced by a fixed joint and the solution could be implemented with just two push rods. For example, in one embodiment a push rod is coupled to the center of the chuck and the other two push rods are connected to other points underneath the chuck. The center rod will be substantially stationary, while the other two push rods move up and down.

In another embodiment, the three push rods are connected to the chuck in a position near the periphery of the chuck and the three points where the pushrods are connected form a equilateral triangle whose center is underneath the center of the substrate.

It is noted that the embodiments illustrated in FIG. 6B are exemplary. Other embodiments may utilize different positions for the push rods, as long as the controller may control the orientation of the surface of the substrate. The embodiments illustrated in FIG. 6B should therefore not be interpreted to be exclusive or limiting, but rather exemplary or illustrative.

Figure 6C:
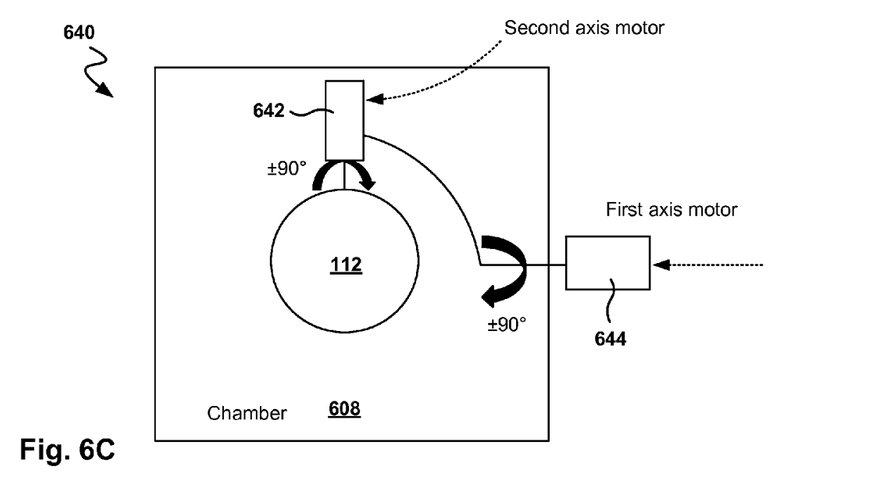
FIG. 6C illustrates a chamber where the precession motion applied to the chuck/substrate is performed by two axis motors, according to one embodiment.

FIG. 6C illustrates a chamber where the precession motion applied to the chuck/substrate is performed by two axis motors, according to one embodiment. FIG. 6C is a top view of chamber 640, which includes two axis motors 642 and 644. The two axis motors combined produced the desired precession on the chuck/substrate. A first axis motor 644 creates a teeter-totter effect that lifts the second axis motor 642 up and down. The second axis motor 642 rotates to generate a precession effect on the chuck/substrate.

The combined effect produces the desire rotating precession on the surface of the substrate. The controller of chamber 640 controls independently each of the two axis motors to obtain the desired precession effect on the substrate. For example, the precession effect may be smooth and slowly changing the orientation of the surface of the substrate, or the precession effect may produce fast changes on the orientation of the surface of the substrate.

In one embodiment, first axis motor 644 is outside the chamber while the second axis motor 642 is inside the chamber, but in other embodiments both axis motors may be situated inside the chamber (at vacuum) or outside the chamber. Further, in another embodiment, the motor may be inside the chamber but encased in a mini-chamber at atmospheric pressure under the chuck.

In the embodiments illustrated in FIGS. 4A, 6A, 6B and 6C, there is no need for special spinning connectors. All that is needed are flexible connectors that move with the motion of the chuck. For example's, the flexible connectors may include flexible tubing, flexible pipes, or flexible cables, etc. In addition, in some embodiments, casing may be installed around the connectors to lower the wear on the connectors.

It is noted that the embodiments illustrated in FIGS. 4A, 6A, 6B and 6C are exemplary. Other embodiments may utilize different rotating devices, situate the motors or cams in different locations, combine a motor with a pushing rod, etc., that enable the precession effect without having to spin the chuck. The embodiments illustrated in FIGS. 4A, 6A, 6B and 6C should therefore not be interpreted to be exclusive or limiting, but rather exemplary or illustrative.

Figure 7:
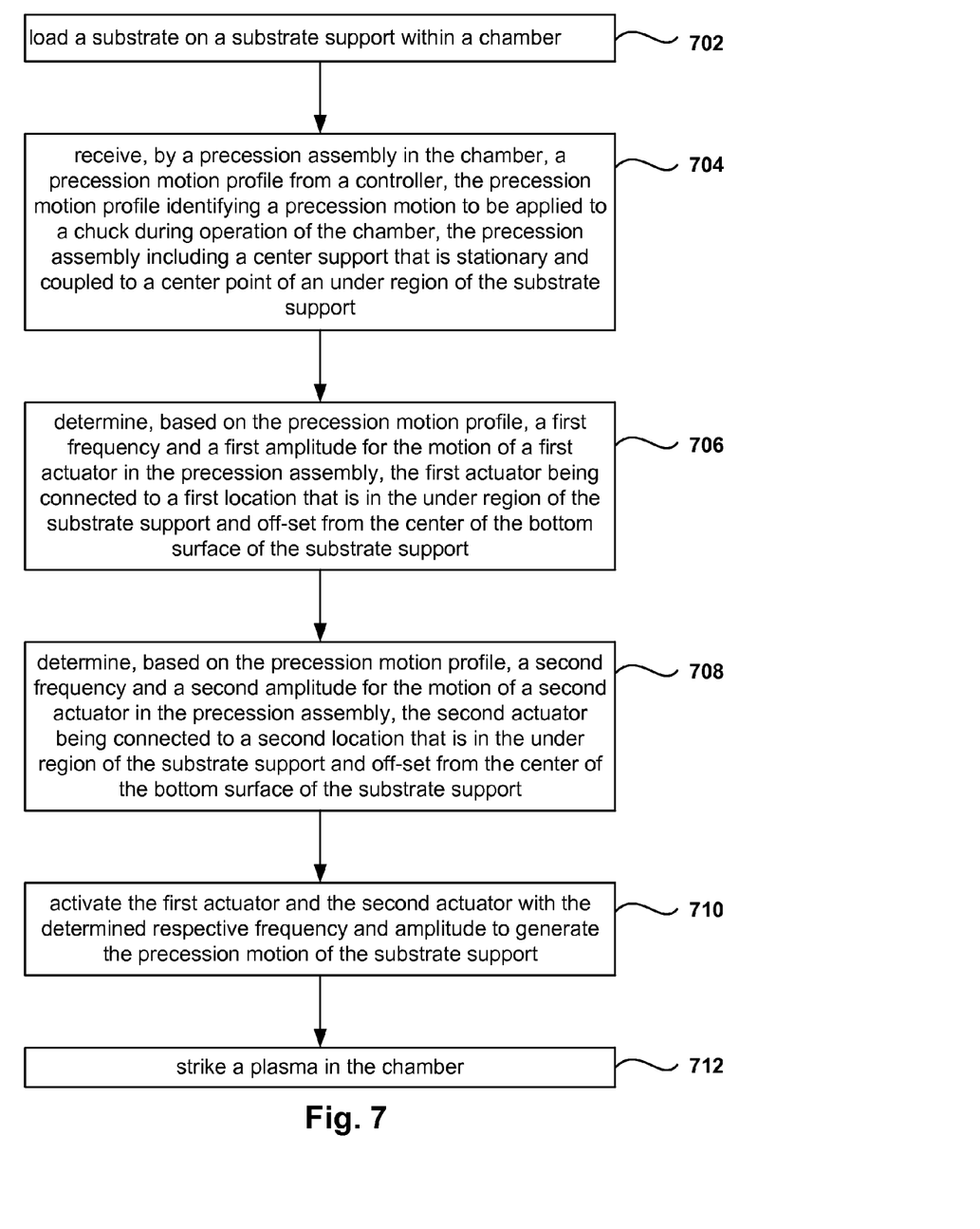
FIG. 7 is a flowchart of an algorithm for processing the substrate by applying a precession motion that changes over time, according to one embodiment.

FIG. 7 is a flowchart of an algorithm for processing the substrate by applying a precession motion that changes over time, according to one embodiment. While the various operations in this flowchart are presented and described sequentially, one of ordinary skill will appreciate that some or all of the operations may be executed in a different order, be combined or omitted, or be executed in parallel.

Operation 702 is for loading a substrate on a substrate support within a chamber. From operation 702, the method flows to operation 704 where a precession assembly in the chamber receives a precession motion profile from a controller. The precession motion profile identifies a precession motion to be applied to a chuck during operation of the chamber. The precession assembly includes a center support that is stationary and coupled to a center point of an under region of the substrate support.

From operation 704, the method flows to operation 706 to determine, based on the precession motion profile, a first frequency and a first amplitude for the motion of a first actuator in the precession assembly. The first actuator is connected to a first location that is in the under region of the substrate support and off-set from the center of the bottom surface of the substrate support.

From operation 706, the method flows to operation 708 to determine, based on the precession motion profile, a second frequency and a second amplitude for the motion of a second actuator in the precession assembly. The second actuator is connected to a second location that is in the under region of the substrate support and off-set from the center of the bottom surface of the substrate support.

From operation 708, the method flows to operation 710 to activate the first actuator and the second actuator with the determined respective frequency and amplitude to generate the precession motion of the substrate support. In operation 712, the plasma is stricken in the chamber.

The precession motion is imparted when the substrate is on the substrate support, the precession motion causing a rotating tilt of the substrate support without rotation of the substrate support. Further, the rotating tilt of the substrate is configured to cause ions, generated by an ion source above the chamber, to impinge upon a surface of the substrate continually varying angles of incidence.

The precession motion is created when the first actuator and the second actuator move up and down relative to the center support, such that the first actuator moves up and down in accordance with a first frequency and the second actuator moves up and down in accordance with a second frequency, the first frequency being independent of the second frequency.

Figure 8:
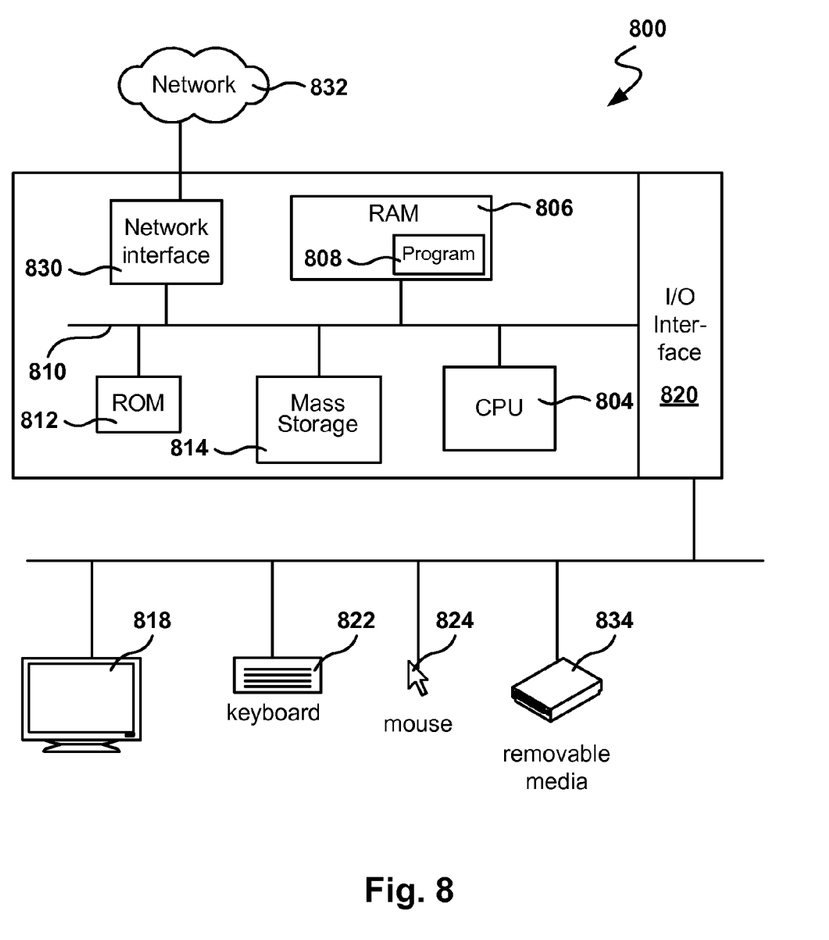
FIG. 8 is a simplified schematic diagram of a computer system for implementing embodiments.

FIG. 8 is a simplified schematic diagram of a computer system for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 806, read-only memory (ROM) 812, and mass storage device 814. System controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for processing a substrate, the method comprising:

loading a substrate on a substrate support within a chamber; and causing, by a precession assembly, a precession motion of the substrate support, wherein the precession motion is imparted when the substrate is on the substrate support, the precession motion causing a rotating tilt of the substrate support without rotation of the substrate support, the rotating tilt of the substrate being configured to cause ions, generated by an ion source above the chamber, to impinge upon a surface of the substrate continually varying angles of incidence, wherein the precession assembly includes a center support, a first actuator, and a second actuator, the center support being stationary in terms of up and down motion and coupled to a center point of an under region of the substrate support, wherein the first actuator is connected to a first location that is in the under region of the substrate support and off-set from the center point, wherein the second actuator is connected to a second location that is in the under region of the substrate support and off-set from the center point, wherein the precession motion is created when the first actuator and the second actuator move up and down relative to the center support, such that the first actuator moves up and down in accordance with a first frequency and the second actuator moves up and down in accordance with a second frequency, the first frequency being independently set relative to the second frequency;

wherein the first frequency is set to be temporally offset from the second frequency to produce the rotating tilt about the center support without said rotation of the substrate support.

2. The method as recited in claim 1, wherein the first actuator moves up and down with a first amplitude, and the second actuator moves up and down with a second amplitude, wherein the first amplitude is independently controlled from the second amplitude.

3. The method as recited in claim 1, wherein a controller is in communication with the precession assembly to program the precession motion, wherein the controller manages the precession motion to set an angle of incidence of the ions from a plasma to control how features on the substrate are etched.

4. The method as recited in claim 1, wherein the precession motion is cyclical, wherein the first location is in an initial position when the substrate is loaded onto the substrate support, wherein a distance from the first location to the initial position over time changes sinusoidally.

5. The method as recited in claim 1, wherein the first location and the second location are in a periphery of the under region, wherein the first location is separated 90 degrees from the second location with reference to the center point.

6. The method as recited in claim 1, wherein operations of the method are performed by a computer program when executed by one or more processors, the computer program being embedded in a non-transitory computer-readable storage medium.

\* \* \* \* \*